(12) United States Patent
Sato

(10) Patent No.: US 8,736,029 B2
(45) Date of Patent: May 27, 2014

(54) SEMICONDUCTOR APPARATUS

(75) Inventor: Keigo Sato, Toyota (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 13/552,230

(22) Filed: Jul. 18, 2012

(65) Prior Publication Data

US 2013/0105933 A1    May 2, 2013

Related U.S. Application Data

(63) Continuation of application No. PCT/JP2011/074732, filed on Oct. 26, 2011.

(51) Int. Cl.
    *H01L 29/02*      (2006.01)
(52) U.S. Cl.
    USPC ....................................................... 257/632
(58) Field of Classification Search
    USPC ............... 257/629, 632, 651, 586, E29.171, 257/E21.545
See application file for complete search history.

(56) References Cited

U.S. PATENT DOCUMENTS

| | | | | |
|---|---|---|---|---|
| 4,194,934 A | * | 3/1980 | Blaske et al. | 438/542 |
| 4,605,948 A | * | 8/1986 | Martinelli | 257/492 |
| 5,686,980 A | * | 11/1997 | Hirayama et al. | 349/110 |
| 5,712,506 A | * | 1/1998 | Shimoto et al. | 257/633 |
| 6,207,473 B1 | * | 3/2001 | Hirai et al. | 438/106 |
| 6,285,055 B1 | * | 9/2001 | Gosain et al. | 257/317 |
| 6,307,232 B1 | | 10/2001 | Akiyama | |
| 6,429,501 B1 | * | 8/2002 | Tsuchitani et al. | 257/493 |
| 7,408,207 B2 | * | 8/2008 | Hashimoto et al. | 257/187 |
| 7,977,669 B2 | * | 7/2011 | Yukawa et al. | 257/40 |
| 8,242,486 B2 | * | 8/2012 | Fujii | 257/40 |
| 2001/0049197 A1 | | 12/2001 | Yamazaki et al. | |
| 2002/0017697 A1 | * | 2/2002 | Kitamura et al. | 257/492 |
| 2003/0062599 A1 | * | 4/2003 | Egami et al. | 257/632 |
| 2005/0161761 A1 | | 7/2005 | Hatade | |
| 2005/0173751 A1 | * | 8/2005 | Ishii et al. | 257/314 |
| 2005/0181551 A1 | * | 8/2005 | Yamazaki et al. | 438/161 |
| 2006/0103000 A1 | * | 5/2006 | Kurosawa | 257/690 |
| 2009/0224237 A1 | * | 9/2009 | Isa et al. | 257/40 |

FOREIGN PATENT DOCUMENTS

| | | | | |
|---|---|---|---|---|
| JP | 10-341018 A | | 12/1998 | |
| JP | 2002353455 A | * | 12/2002 | ............ H01L 29/78 |
| JP | 2005-209983 A | | 8/2005 | |
| JP | 2006-140169 A | | 6/2006 | |
| JP | 2010-003762 A | | 1/2010 | |
| JP | 2011-119366 A | | 6/2011 | |
| JP | 2011-199223 A | | 10/2011 | |

OTHER PUBLICATIONS

International Search Report mailed Jan. 31, 2012 of PCT/JP2011/074732 & Written Opinion.

* cited by examiner

*Primary Examiner* — Hsien Ming Lee
*Assistant Examiner* — Michele Fan
(74) *Attorney, Agent, or Firm* — Kenyon & Kenyon LLP

(57) ABSTRACT

A semiconductor apparatus includes a semiconductor substrate. The semiconductor substrate includes an active region in which a semiconductor device is formed, and a peripheral region which is located between the active region and an edge surface of the semiconductor substrate. A first insulating layer including conductive particles is formed above at least a part of the peripheral region. By constructing the semiconductor apparatus in this manner, generation of a high electric field in the peripheral region can be suppressed. Therefore, voltage endurance characteristics of the semiconductor apparatus can be improved.

5 Claims, 7 Drawing Sheets

SEMICONDUCTOR APPARATUS

CROSS-REFERENCE TO RELATED APPLICATIONS

This is a Continuation of International Application No. PCT/JP2011/074732 filed on Oct. 26, 2011, the disclosure of which is hereby incorporated by reference herein in its entirety.

TECHNICAL FIELD

The technique disclosed in the present specification relates to a semiconductor apparatus.

BACKGROUND ART

Japanese Patent Application Publication No. 2005-209983 (hereinafter referred to as a patent document 1) discloses a semiconductor apparatus having an insulating layer and a plurality of field plates (conductive plates) provided on an upper surface of a peripheral region which is located between an active region (a region in which a MOSFET is formed) and an edge surface of a semiconductor substrate. By providing the field plates on the peripheral region in this manner, an electric field in the peripheral region can be reduced.

SUMMARY OF INVENTION

Technical Problem

With the technique described above which uses the field plates, a potential difference between the active region and the edge surface of the semiconductor substrate is applied to the group of field plates on the peripheral region. Therefore, the greater the number of field plates that are installed, the smaller the potential difference is between the field plates and the higher a uniformity of the electric field in the peripheral region is. In other words, increasing the number of installed field plates increases voltage endurance characteristics of the semiconductor apparatus.

On the other hand, a field plate is normally patterned using a photolithographic technique. Forming a large number of field plates on the peripheral region requires that a width of the field plates be reduced. However, there is a limit to field plate miniaturization that can be achieved by the photolithographic technique. For this reason, with the technique disclosed in the patent document 1, there had been a limit to improving the voltage endurance characteristics of the semiconductor apparatus.

In consideration thereof, the present specification provides a semiconductor apparatus with higher voltage endurance characteristics.

Solution to Problem

The semiconductor apparatus disclosed in the present specification includes a semiconductor substrate and a first insulating layer. The semiconductor substrate includes an active region in which a semiconductor device is formed, and a peripheral region which is located between the active region and an edge surface of the semiconductor substrate. The first insulating layer includes conductive particles and is formed above at least a part of the peripheral region.

It should be noted that, in the present specification, conductive particles refer to particles which are conductive and which have a width ranging between 10 nm and 100 μm at a widest portion thereof. Furthermore, in the present specification, an insulator refers to a substance having an electric resistivity of $10^{14}$ Ωm or higher.

The first insulating layer is formed above the peripheral region of the semiconductor apparatus. Since the first insulating layer includes conductive particles, a potential difference between the active region and the edge surface of the semiconductor substrate is applied to the conductive particles. Because the conductive particles are minute, a large number of conductive particles can be included in the first insulating layer. Therefore, due to the first insulating layer, an electric field distribution in the peripheral region below the first insulating layer can be made more uniform than that below a conventional field plate. As a result, the semiconductor apparatus has higher voltage endurance characteristics than a conventional semiconductor apparatus.

DESCRIPTION OF EMBODIMENTS

The semiconductor apparatus disclosed in this specification may further include a second insulating layer not including the conductive particles. The second insulating layer may be interposed between the first insulating layer and the semiconductor substrate.

According to such a configuration, the electric field in the peripheral region can be further reduced.

The semiconductor apparatus disclosed in this specification may further includes a p-type region, an n-type region, a p-type low concentration region, and a n-type low concentration region. The p-type region may be formed in a range in the semiconductor substrate which is located at a border between the peripheral region and the active region and exposed at an upper surface of the semiconductor substrate. The n-type region may be formed in a range in the semiconductor substrate which is exposed at the upper surface and the edge surface of the semiconductor substrate. The p-type low concentration region may have an impurity concentration lower than the p-type region and the n-type region. The n-type low concentration region may have an impurity concentration lower than the p-type region and the n-type region. The p-type region and the n-type region may be formed in a range in the semiconductor substrate which is located between the p-type region and the n-type region and exposed at the upper surface of the semiconductor substrate. The first insulating layer may be formed above an entirety of the p-type low concentration region and the n-type low concentration region.

Since the p-type low concentration region and the n-type low concentration region are regions in which depletion layers spread, a high voltage is applied to these regions. According to the configuration described above, an electric field can be reduced in an entirety of these regions in which a high voltage is applied.

Figure 1:
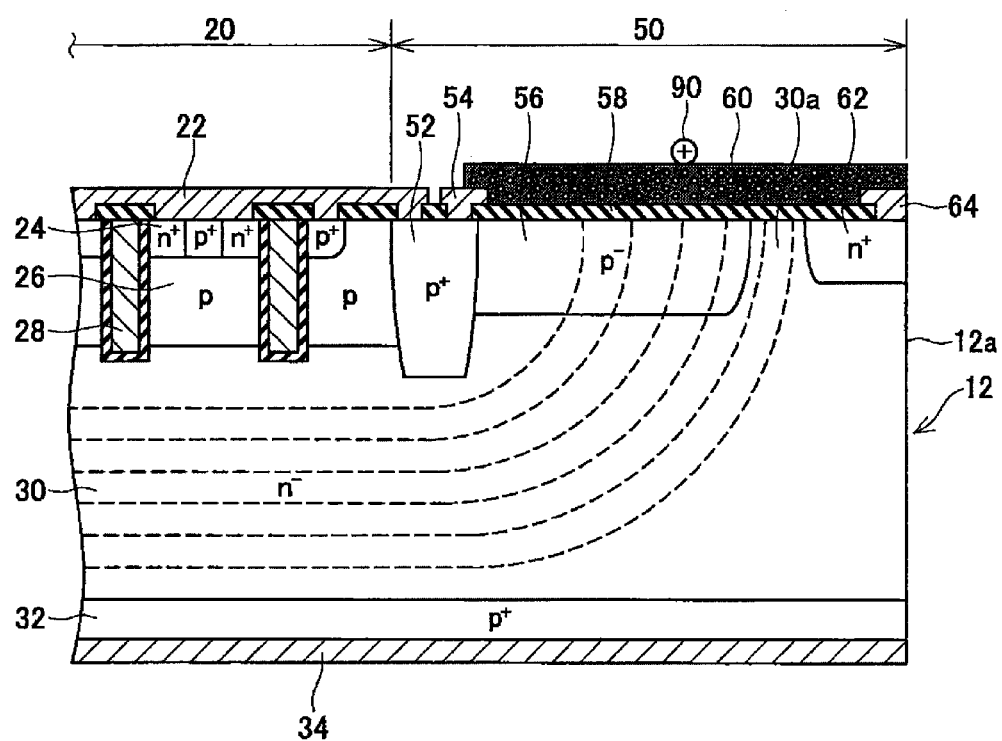
FIG. 1 is a longitudinal sectional view of a semiconductor apparatus 10.

A semiconductor apparatus 10 shown in FIG. 1 includes a semiconductor substrate 12, electrodes and insulating layers formed on an upper surface and a lower surface of the semiconductor substrate 12, and the like. The semiconductor substrate 12 includes an active region 20 and a peripheral region 50. An IGBT is formed in the active region 20. The active region 20 is formed in an approximately central portion of the semiconductor substrate 12 when the semiconductor substrate 12 is viewed from an upper surface side. The peripheral region 50 is a region which is located between the active region 20 and an edge surface (a peripheral surface) 12a of the semiconductor substrate 12. Therefore, the active region 20 is surrounded by the peripheral region 50 when seen from above in a plan view of the semiconductor substrate 12.

Trenches are formed on an upper surface of the active region 20. An inner surface of each trench is covered by a gate insulator. A gate electrode 28 is formed in each trench. An emitter electrode 22 is formed on the upper surface of the active region 20. A collector electrode 34 is formed on the lower surface of the semiconductor substrate 12. Electrodes on an upper surface side of the semiconductor apparatus 10 (for example, the emitter electrode 22, a gate electrode pad (not shown: a pad connected to the respective gate electrodes 28), and other signal extraction electrodes) are connected to an external conductive member by a brazing material such as solder, wire bonding, or conductive paste, or the like.

N-type emitter regions 24, a p-type body region 26, an n-type drift region 30, and a p-type collector region 32 are formed in the active region 20. The emitter regions 24 are formed in ranges that are exposed at the upper surface of the semiconductor substrate 12. The emitter regions 24 are formed in the ranges that are in contact with the gate insulators. The emitter regions 24 are ohmically connected to the emitter electrode 22. The body region 26 is formed to the sides of the emitter regions 24 and on a lower side of the emitter region 24. The body region 26 is in contact with the gate insulators on the lower side of the emitter regions 24. The body region 26 between two emitter regions 24 has a high p-type impurity concentration and is ohmically connected to the emitter electrode 22. The drift region 30 is formed on a lower side of the body region 26. The drift region 30 is separated from the emitter region 24 by the body region 26. The drift region 30 is in contact with a gate insulator at a lower end of the trench. The collector region 32 is formed on a lower side of the drift region 30. The collector region 32 has a high p-type impurity concentration and is ohmically connected to the collector electrode 34. The IGBT is formed in the active region 20 by the respective electrodes and the respective semiconductor regions described above.

A deep p-type region 52, a RESURF region 56, and an edge n-type region 62 are formed in the peripheral region 50. The deep p-type region 52 is located at a border between the active region 20 and the peripheral region 50. The deep p-type region 52 is formed in a range that is exposed at the upper surface of the semiconductor substrate 12. The deep p-type region 52 is in contact with the body region 26. The deep p-type region 52 is formed to a depth that is deeper than the gate electrode 28 in the active region 20. The deep p-type region 52 has a high p-type impurity concentration and is ohmically connected to an electrode 54 formed on the deep p-type region 52. The RESURF region 56 is adjacent to and in contact with the deep p-type region 52. The RESURF region 56 is formed in a range that is exposed at the upper surface of the semiconductor substrate 12. The RESURF region 56 is formed to a depth that is shallower than the deep p-type region 52. A p-type impurity concentration of the RESURF region 56 is lower than that in the deep p-type region 52. In addition, the p-type impurity concentration of the RESURF region 56 is lower than an n-type impurity concentration in the edge n-type region 62. The edge n-type region 62 is formed in a range which is exposed at an edge surface 12a of the semiconductor substrate 12 and exposed at the upper surface of the semiconductor substrate 12. The edge n-type region 62 has a relatively high n-type impurity concentration and is ohmically connected to an electrode 64 formed on the edge n-type region 62. The drift region 30 described earlier is formed on lower sides of the deep p-type region 52, the RESURF region 56, and the edge n-type region 62. In other words, the drift region 30 spreads from the active region 20 to the peripheral region 50. In addition, the drift region 30 also exists in a range which is located between the RESURF region 56 and the edge n-type region 62, and is exposed at the upper surface of the semiconductor substrate 12 in that range. Hereinafter, the drill region 30 between the RESURF region 56 and the edge n-type region 62 will be referred to as a peripheral drift region 30a. An n-type impurity concentration of the drift region 30 is lower than the p-type impurity concentration of the deep p-type region 52 and lower than the n-type impurity concentration of the edge n-type region 62. Even in the peripheral region 50, the collector region 32 is formed on a lower side of the drift region 30.

Figure 2:
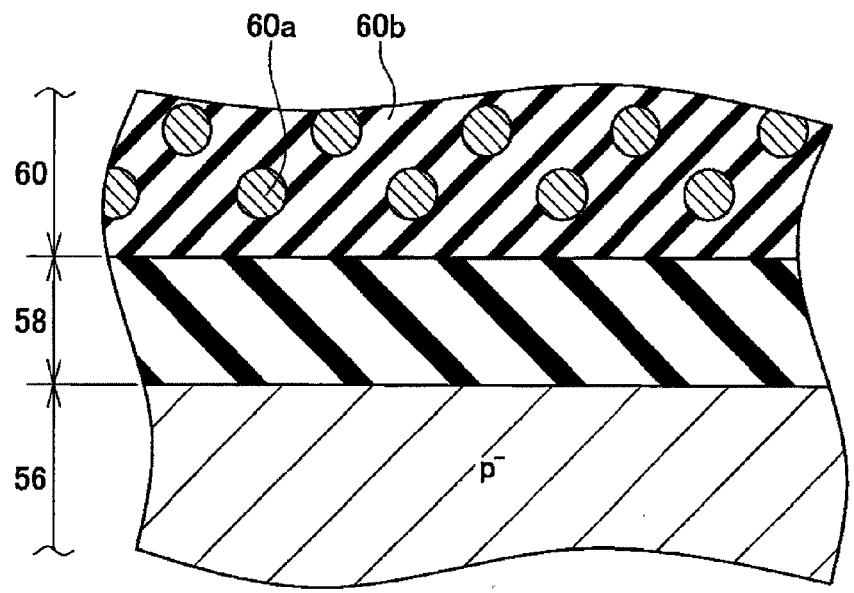
FIG. 2 is an enlarged sectional view of a RESURF region 56 and insulating layers 58 and 60.

An insulating layer 58 and an insulating layer 60 are formed on the peripheral region 50. The insulating layer 58 is formed on upper surfaces of the RESURF region 56 and the peripheral drift region 30a. The insulating layer 60 is formed on the insulating layer 58. The insulating layer 60 is formed above the RESURF region 56, the peripheral drift region 30a, and the edge n-type region 62. The insulating layer 60 includes a large number of conductive particles. In other words, as shown in FIG. 2, the insulating layer 60 is constituted by conductive particles 60a and an insulating material 60b that exists so as to surround the conductive particles 60a. For example, the conductive particles 60a are constituted by Cu or polysilicon. The conductive particles 60a are particles having a width ranging between 10 nm to 100 μm at a widest portion thereof. The width of the conductive particles 60a is more favorably equal to or less than 10 μm. For example, conductive particles with a particle diameter of 10 μm or less are favorable. However, in a case in which the conductive particles 60a are linear particles, the width of the conductive particles 60a (in other words, a length of the conductive particles) may be equal to or less than 100 μm. The conductive particles 60a are arranged dispersed in the insulating material 60b. Therefore, the insulating layer 60 has an insulation property. On the other hand, conductive particles do not exist inside the insulating layer 58.

When the IGBT in the active region 20 is turned off, a high voltage $V_{ce}$ is applied between the collector electrode 34 and the emitter electrode 22. At this point, a potential of the edge n-type region 62 becomes approximately equal to a potential of the collector electrode 34. In addition, a potential of the deep p-type region 52 becomes approximately equal to a potential of the emitter electrode 22. Therefore, a voltage V1 that is approximately equal to the voltage $V_{ce}$ is applied between the edge n-type region 62 and the deep p-type region 52. As a result, a depletion layer spreads from the deep p-type region 52 to the edge n-type region 62. The RESURF region 56 promotes expansion of the depletion layer. Consequently, the depletion layer spreads across approximately an entirety of the RESURF region 56 and the peripheral drift region 30a. Due to the depletion layer having spread in this manner, an insulation property between the edge n-type region 62 and the deep p-type region 52 is secured. Therefore, in a state in which the IGBT is off, equipotential lines are distributed in the semiconductor substrate 12 as depicted by dotted lines in FIG. 1.

Figure 3:
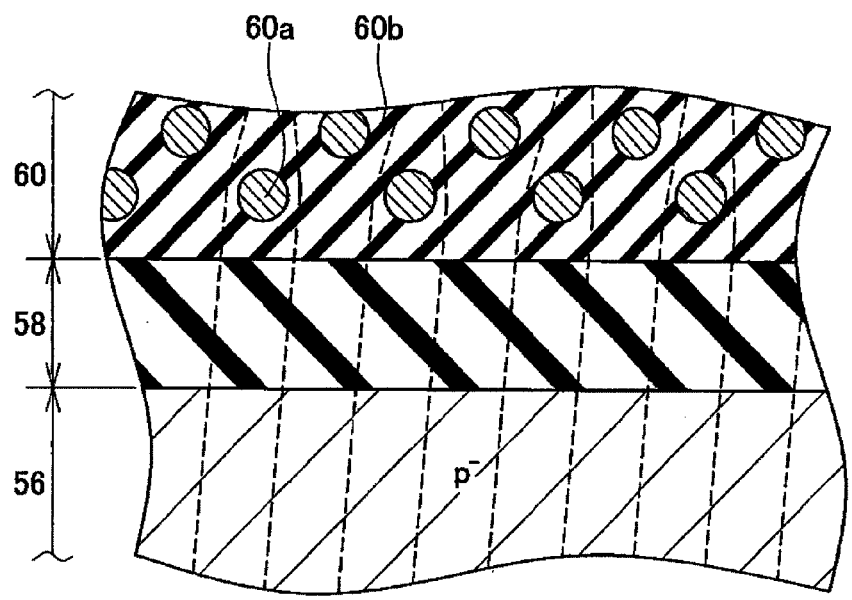
FIG. 3 is a sectional view showing an electric potential distribution at a cross section shown in FIG. 2 when an IGBT is off.

The voltage V1 between the edge n-type region 62 and the deep p-type region 52 is also applied to the insulating layer 60. Since a large number of conductive particles 60a exist inside the insulating layer 60, divided voltages of the voltage V1 are applied among the respective conductive particles 60a. Since the conductive particles 60a are dispersed approximately uniformly, potential differences among the respective conductive particles 60a are approximately equal to each other. For this reason, as depicted by dotted lines in FIG. 3, equipotential lines are distributed at approximately even intervals in the RESURF region 56. As described above, when the insulating layer 60 includes conductive particles 60a, an electric field in the RESURF region 56 becomes uniform and an occurrence of a localized high electric field in the RESURF region 56 is suppressed. Moreover, the peripheral drift region 30a is depleted in a similar manner to the RESURF region 56. In addition, the insulating layer 60 is also formed above the peripheral drift region 30a. Therefore, due to an influence of the conductive particles in the insulating layer 60, an electric field in the peripheral drift region 30a becomes uniform in a similar manner to the RESURF region 56. In other words, an occurrence of a localized high electric field is also suppressed in the peripheral drift region 30a.

As shown in FIG. 1, an extraneous charge 90 (for example, a movable ion such as Na, Cu, or Cl) may adhere to a surface of the peripheral region 50. With a conventional semiconductor apparatus, an electric field generated by such an adherent extraneous charge sometimes disturbs an electric field in the peripheral region and causes electric field concentration. However, with the semiconductor apparatus 10 according to the present embodiment, the insulating layer 60 including a large number of conductive particles is formed on a surface of the peripheral region 50. Due to a shielding effect of the conductive particles in the insulating layer 60, an influence of the electric field generated by the extraneous charge 90 on the electric field in the peripheral region 50 is suppressed. In this manner, with this semiconductor apparatus 10, an occurrence of a localized high electric field in the peripheral region 50 due to adherence of the extraneous charge 90 can be suppressed.

In the semiconductor apparatus 10 according to the present embodiment, the insulating layer 60 is formed so as to cover an entirety of upper portions of the RESURF region 56 and the peripheral drift region 30a. In other words, the electric field concentration is reduced by the insulating layer 60 in an entirety of the region in which the depletion layer extends in the peripheral region 50 (that is, the region in which the potential differences occur). Therefore, the semiconductor apparatus 10 has superior voltage endurance characteristics.

The effect of making the electric field in the peripheral region uniform and the effect of suppressing the influence of the extraneous charge described above can also be achieved using a field plate such as that described in the patent document 1 or the like. However, it has been found that both of the effects described above are enhanced by arranging a greater number of smaller conductors such as the conductive particles described earlier on the peripheral region as compared to arranging large conductors such as field plates on the peripheral region. Therefore, the semiconductor apparatus 10 according to the present embodiment has higher voltage endurance characteristics than the conventional semiconductor apparatus including the field plates. In addition, since voltage endurance characteristics in the peripheral region can be enhanced in this manner, a structure of the present embodiment enables sufficient voltage endurance characteristics to be secured even when a width of the peripheral region is set narrower than what is conventional. Accordingly, the structure of the present invention enables a smaller semiconductor apparatus to be provided.

Next, a method of manufacturing the semiconductor apparatus 10 will be described. A structure of the semiconductor apparatus 10 with the exception of the insulating layer 60 can be formed by conventional and known methods. Accordingly, only methods of forming the insulating layer 60 will now be described. Applying a flowable material, applying tape, or sputtering can be adopted as a conceivable method of forming the insulating layer 60.

Figure 4:
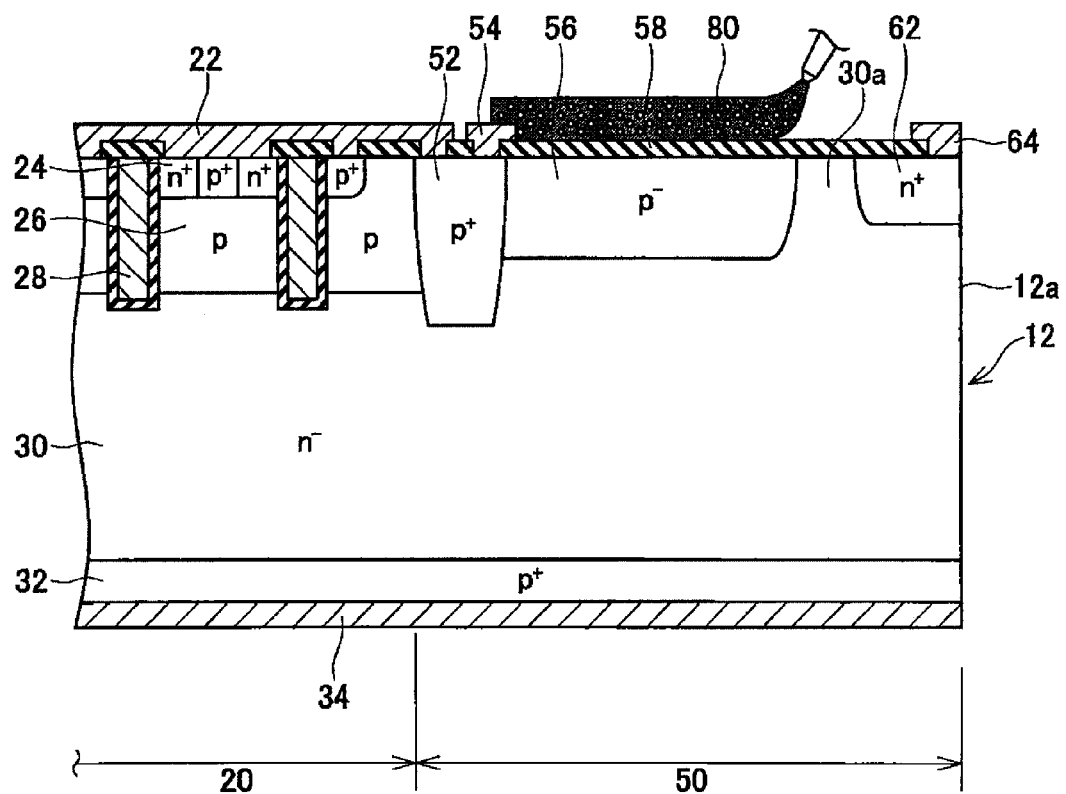
FIG. 4 is an explanatory diagram of a method of forming an insulating layer 60 by applying a flowable material.

With the method of applying the flowable material, as shown in FIG. 4, a flowable material 80 is applied on the peripheral region 50 in which the insulating layer 60 has not been formed. The flowable material 80 is constructed of a material formed by dispersing conductive particles into a flowable binder. After the flowable material 80 is applied onto the peripheral region 50, the flowable material 80 (in other words, the binder) is hardened by heating. The hardened binder becomes the insulating material 60b shown in FIG. 2. Accordingly, the insulating layer 60 is formed. A resin (for example, a polyimide resin), $SiO_2$, SOG, or the like can be used as the binder.

Figure 5:
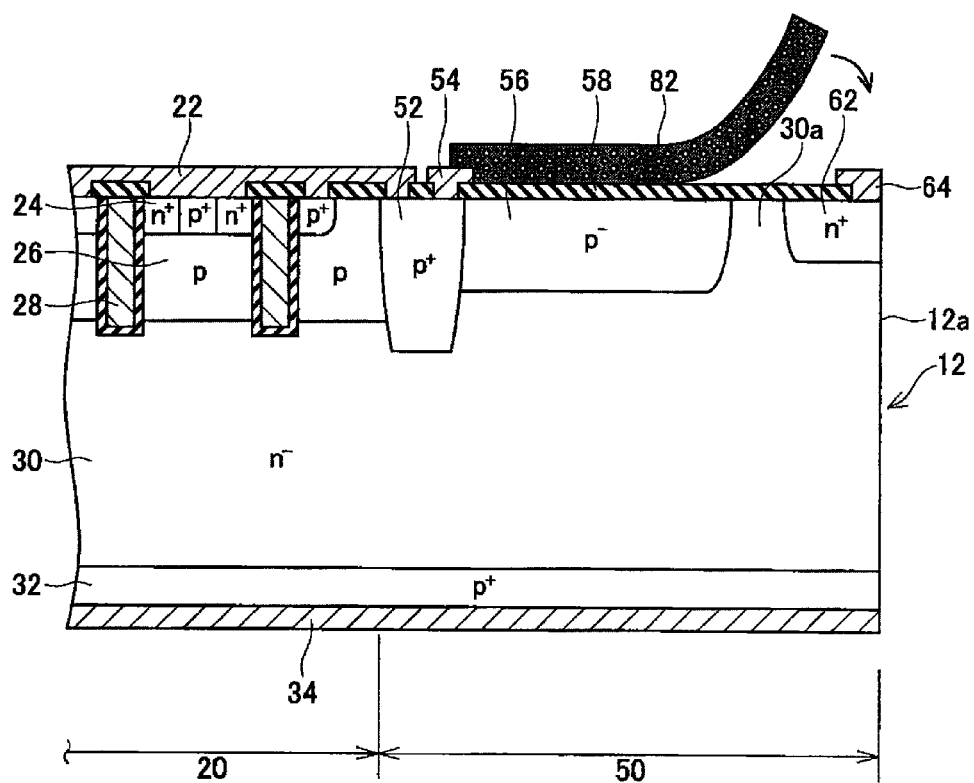
FIG. 5 is an explanatory diagram of a method of forming the insulating layer 60 by applying tape.

With the method of applying the tape, as shown in FIG. 5, an insulating tape 82 is applied on the peripheral region 50 of the semiconductor substrate in which the insulating layer 60 has not been formed. The insulating tape 82 is constituted by a tape backing made of an insulating resin and conductive particles arranged distributed in the tape backing. In other words, the tape backing functions as the insulating material 60b described above. An organic resin such as a polyimide resin can be used as the tape backing.

Figure 6:
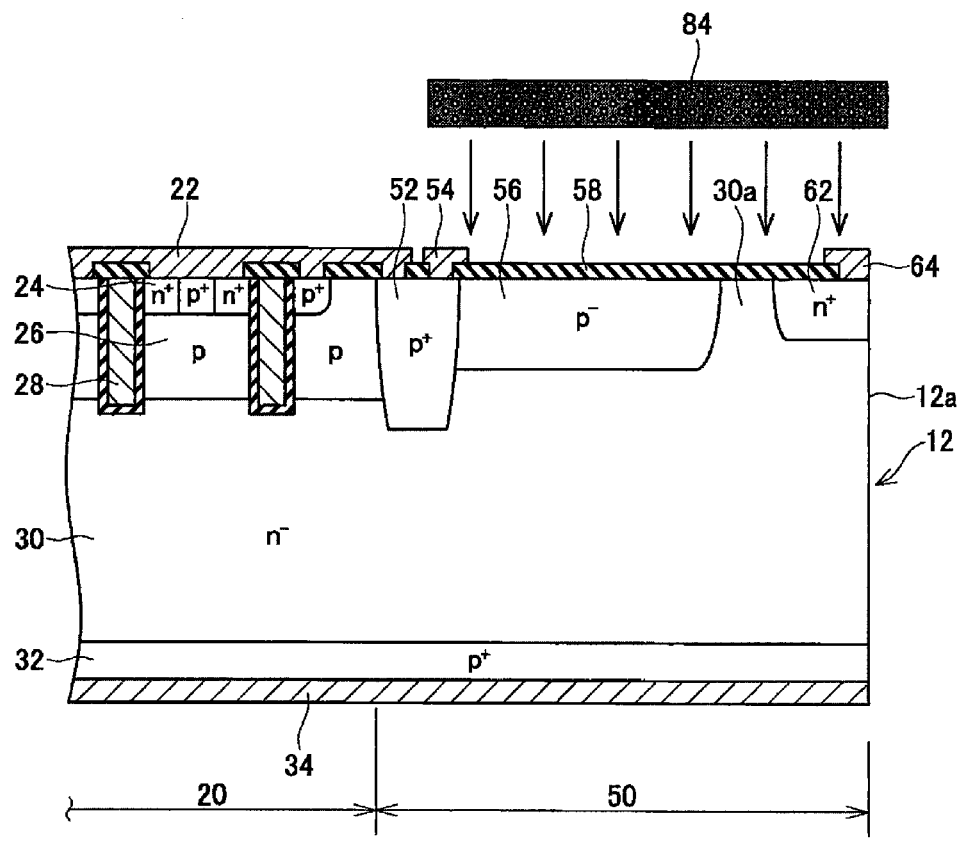
FIG. 6 is an explanatory diagram of a method of forming an insulating layer 60 by sputtering.

With the sputtering, as shown in FIG. 6, the insulating layer 60 is grown on the peripheral region 50 of the semiconductor substrate in which the insulating layer 60 has not been formed using a target 84 constructed of a material formed by dispersing conductive particles in an insulating material. In sputtering, SiN, $SiO_2$, or the like can be used as the insulating material 60b.

The insulating layer 60 can be easily formed using any of the methods described above. Manufacturing the conventional semiconductor apparatus including the field plates requires forming the field plates using a photolithographic technique. The photolithographic technique requires performing numerous processes including a process for growing a metallic layer or an insulating layer, a process for forming a mask, an exposure process, and an etching process. Therefore, with the technique in which field plates are formed by the photolithographic technique, a process cost for manufacturing the semiconductor apparatus rises. In particular, the process cost increases significantly when a large number of layers of the field plates are formed as is the case with the patent document 1. In contrast, according to the methods described above, the structure that reduces the electric field in the peripheral region can be formed more readily compared to the conventional methods, and the process cost can be reduced. In addition, since the processes are simplified in the methods described above, the processes can be managed more easily and a variation in characteristics among the manufactured semiconductor apparatuses can be suppressed. Furthermore, using the methods described above offer greater design freedom compared to cases in which the photolithographic technique is used.

Figure 7:
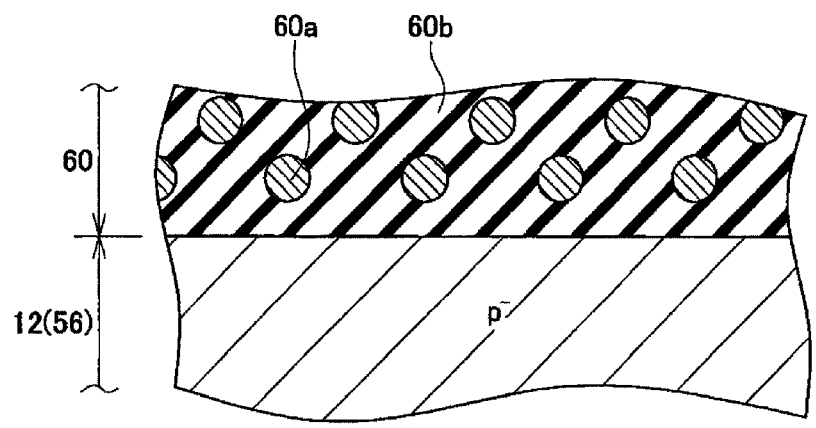
FIG. 7 is an enlarged sectional view corresponding to FIG. 2 of a semiconductor apparatus according to a first modification.

In the embodiment described above, the insulating layer 58 not including conductive particles is interposed between the insulating layer 60 including conductive particles and the semiconductor substrate 12. Alternatively, as shown in FIG. 7, the insulating layer 60 including the conductive particles may be formed directly on the semiconductor substrate 12. Even with such a structure, generation of the high electric field in the peripheral region 50 can be suppressed. However, when the insulating layer 60 is formed directly on the semiconductor substrate 12, a distance between the conductive particles and the semiconductor substrate 12 is extremely short. Therefore, a semiconductor layer within a range near the conductive particles is fixed to a potential of the conductive particles and a potential in that range becomes approximately constant. As a result, the electric field tends to become stronger in a semiconductor layer adjacent to the range having the constant potential. In consideration thereof, the electric field can be suppressed more effectively by interposing the insulating layer 58 between the insulating layer 60 and the semiconductor substrate 12 as in the embodiment described above.

Figure 8:
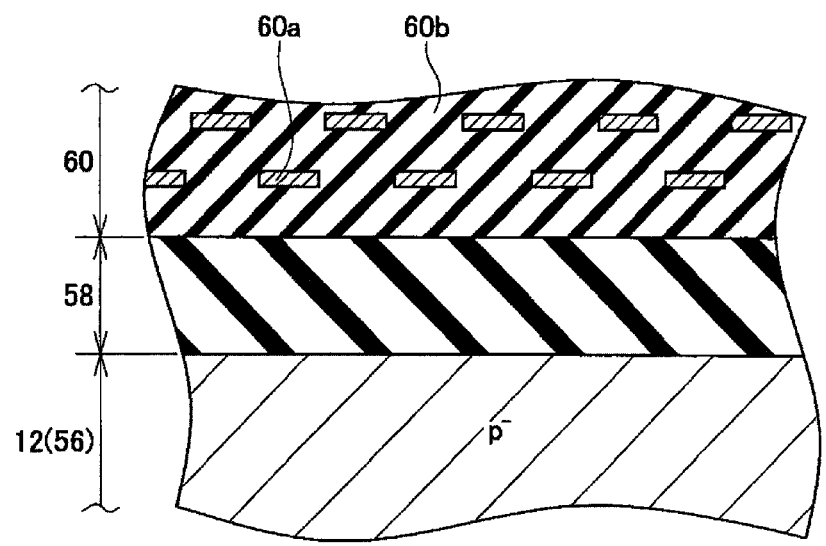
FIG. 8 is an enlarged sectional view corresponding to FIG. 2 of a semiconductor apparatus according to a second modification.
Figure 9:
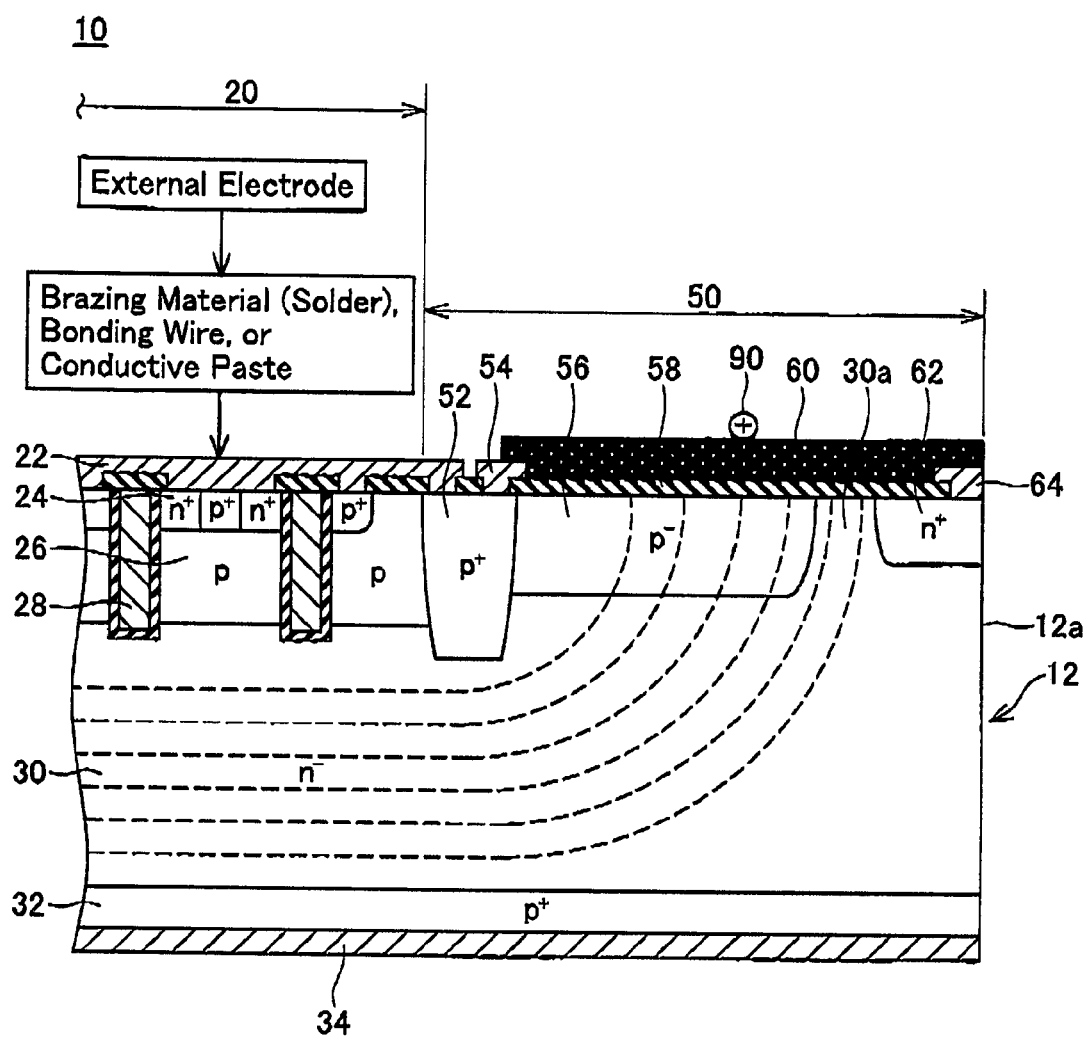
FIG. 9 is a longitudinal sectional view of the semiconductor apparatus 10 of FIG. 1 having an emitter electrode 22 on an upper surface side that is connected to an external conductive member (e.g., an external electrode) by solder, wire bonding, or conductive paste.

Moreover, it is found that the smaller the gaps between conductive particles 60a when all of the conductive particles 60a are viewed from the vertical perspective with respect to the semiconductor substrate 12, the higher the shielding effect of the conductive particles 60a described earlier. Therefore, the conductive particles 60a that are shaped approximately spherical in the embodiment described above may alternatively be shaped as shown in FIG. 8. In FIG. 8, the conductive particles 60a have a flat shape and are arranged along the semiconductor substrate 12 (in other words, the conductive particles 60a are arranged so that a thickness direction of the conductive particles 60a is approximately consistent with a thickness direction of the semiconductor substrate 12). According to such a construction, the gaps between conductive particles 60a when all of the conductive particles 60a are viewed from the vertical perspective with respect to the semiconductor substrate 12 are reduced. Therefore, voltage endurance characteristics of the semiconductor apparatus can be further improved.

In addition, while the RESURF region 56 is formed in the peripheral region 50 in the embodiment described above, alternatively, the RESURF region 56 may not be formed. Alternatively, a different structure such as an FLR may be formed instead of the RESURF region 56. Alternatively, a field plate may be formed in addition to the insulating layer 60 above the semiconductor substrate 12 in the peripheral region 50.

Furthermore, while the IGBT is formed in the active region 20 in the embodiment described above, alternatively, a different semiconductor device may be formed hi the active region 20. For example, a MOSFET, a diode, or the like may be formed.

While preferred embodiments of the present invention have been described using specific terms, such description is for illustrative purposes only and is not intended to limit the scope of the following claims. The techniques described in the claims include various modifications and changes made to the specific embodiments illustrated above. The technical elements described in this specification or in the drawings exhibit technical utility singly or in various combinations and are not limited to the combinations recited in the claims as filed. Moreover, the techniques illustrated in this specification or in the drawings simultaneously attain a plurality of purposes, and attaining one of the purposes per se offers technical utility.

What is claimed is:

1. A semiconductor apparatus comprising:
   a semiconductor substrate having a substantially continuous semiconductor layer extending to an edge surface of the semiconductor substrate;
   a first insulating layer;
   a surface electrode;
   an external electrode; and
   a conductive member,
   wherein the semiconductor layer comprises:
   an active region in which a semiconductor device is formed, and
   a peripheral region which is located between the active region and the edge surface of the semiconductor substrate; and
   wherein
   the surface electrode is located on the active region,
   the first insulating layer includes conductive particles, is formed above at least a part of the peripheral region, and has an opening above at least a part of the surface electrode, and
   the conductive member is different from the conductive particles and electrically connects the surface electrode in the opening to the external electrode.

2. The semiconductor apparatus of claim 1, further comprising a second insulating layer not including the conductive particles and interposed between the first insulating layer and the semiconductor layer.

3. The semiconductor apparatus of claim 1, wherein the conductive member is selected from at least one of a brazing material, bonding wire or a conductive paste.

4. A semiconductor apparatus comprising:
   a semiconductor substrate; and
   a first insulating layer,
   wherein the semiconductor substrate comprises:
   an active region in which a semiconductor device is formed, and
   a peripheral region which is located between the active region and an edge surface of the semiconductor substrate; and
   wherein the first insulating layer includes conductive particles and is formed above at least a part of the peripheral region,
   wherein the semiconductor substrate further comprises:
   a p-type region formed in a range in the semiconductor substrate which is located at a border between the peripheral region and the active region and exposed at an upper surface of the semiconductor substrate,
   an n-type region formed in a range in the semiconductor substrate which is exposed at the upper surface and the edge surface of the semiconductor substrate,
   a p-type low concentration region, an impurity concentration of which is lower than the p-type region and the n-type region, and
   a n-type low concentration region, an impurity concentration of which is lower than the p-type region and the n-type region,
   wherein the p-type low concentration region and the n-type low concentration region are formed in a range in the semiconductor substrate which is located between the p-type region and the n-type region and exposed at the upper surface of the semiconductor substrate, and the first insulating layer is formed above an entirety of the p-type low concentration region and above the n-type low concentration region.

5. A semiconductor apparatus comprising:

a semiconductor substrate;

a first insulating layer;

a surface electrode;

an external electrode; and a solder, where-in the semiconductor substrate comprises:

an active region in which a semiconductor device is formed, and a peripheral region which is located between the active region and an edge surface of the semiconductor substrate; and wherein the surface electrode is located on the active region, the first insulating layer includes conductive particles, is formed above at least a part of the peripheral region, and has an opening above at least a part of the surface electrode, and the solder is different from the conductive particles and electrically connects the surface electrode in the opening to the external electrode.

* * * * *